(12) United States Patent
Cao

(10) Patent No.: US 9,110,126 B2
(45) Date of Patent: Aug. 18, 2015

(54) METHOD FOR MEASURING INTERFACE STATE DENSITY

(71) Applicant: Yongfeng Cao, Shanghai (CN)

(72) Inventor: Yongfeng Cao, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 462 days.

(21) Appl. No.: 13/656,701

(22) Filed: Oct. 20, 2012

(65) Prior Publication Data
US 2013/0099799 A1 Apr. 25, 2013

(30) Foreign Application Priority Data
Oct. 21, 2011 (CN) .......................... 2011 1 0322332

(51) Int. Cl.
*G01R 27/00* (2006.01)
*G01R 31/26* (2014.01)
*H01L 21/66* (2006.01)

(52) U.S. Cl.
CPC ............ *G01R 31/2639* (2013.01); *H01L 22/14* (2013.01); *G01R 31/2648* (2013.01)

(58) Field of Classification Search
CPC ....................................................... H01L 22/14
See application file for complete search history.

(56) References Cited

U.S. PATENT DOCUMENTS

| 5,266,892 | A  | * | 11/1993 | Kimura | .................... | 324/762.07 |
| 7,592,828 | B2 | * | 9/2009  | Song   | ........................ | 324/762.01 |
| 2008/0096292 | A1 | * | 4/2008 | Chatterjee et al. | .............. | 438/14 |
| 2009/0309624 | A1 | * | 12/2009 | Song | ............... | 324/765 |
| 2014/0247067 | A1 | * | 9/2014 | He et al. | .................... | 324/762.09 |

* cited by examiner

*Primary Examiner* — Jermele M Hollington
(74) *Attorney, Agent, or Firm* — Anova Law Group, PLLC

(57) ABSTRACT

The present invention provides a method for measuring the interface state density by a conductance technique. In particular, the method comprises: biasing a MOS capacitor structure to be measured in an accumulation region, measuring the MOS capacitor structure under a fixed bias voltage and at predetermined scanning frequencies in the accumulation region by using a Gp-G model, and calculating the values of the series resistor at respective predetermined scanning frequencies to obtain a series resistor model; obtaining an accurate model in an inversion region from the series resistor model varying with the predetermined scanning frequencies obtained in the accumulation region and obtaining the measurement results of interface state according to the accurate model.

3 Claims, 3 Drawing Sheets

--- biasing a MOS capacitor structure to be measured in an accumulation region, measuring the MOS capacitor structure under a fixed bias voltage and at predetermined scanning frequencies in the accumulation region by using a Cp-G model, and calculating the values of the series resistor in series with the MOS capacitor structure at respective predetermined scanning frequencies to obtain a series resistor model obtaining an accurate model in an inversion region from the series resistor model varying with the predetermined scanning frequencies obtained in the accumulation region, obtaining the measurement results of interface condition according to the accurate model.

--Prior Art--

--Prior Art--

--Prior Art--

--Prior Art-- measurement model

Gp-G model

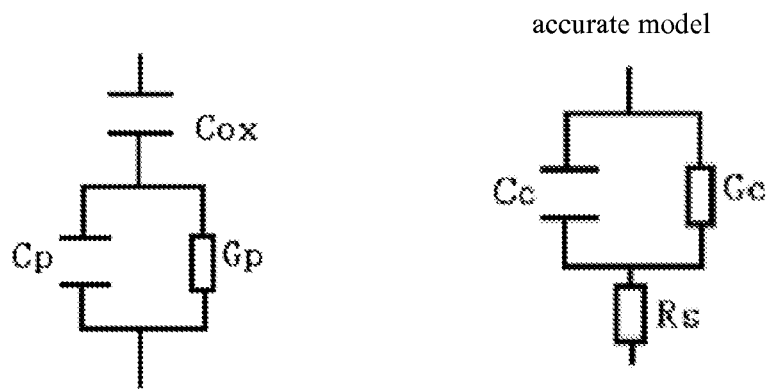

Fig.2c  Fig.2d biasing a MOS capacitor structure to be measured in an accumulation region, measuring the MOS capacitor structure under a fixed bias voltage and at predetermined scanning frequencies in the accumulation region by using a Cp-G model, and calculating the values of the series resistor in series with the MOS capacitor structure at respective predetermined scanning frequencies to obtain a series resistor model obtaining an accurate model in an inversion region from the series resistor model varying with the predetermined scanning frequencies obtained in the accumulation region, obtaining the measurement results of interface condition according to the accurate model.

Fig.3

METHOD FOR MEASURING INTERFACE STATE DENSITY

CROSS-REFERENCE TO RELATED APPLICATION

This application claims the priority benefit of China application serial no. 201110322332.8, filed Oct. 21, 2011. All disclosure of the China application is incorporated herein by reference.

FIELD OF THE INVENTION

The present invention relates to the field of semiconductor, and more particularly to method for measuring interface state density.

BACKGROUND OF THE INVENTION

The currently mainstream method for measuring interface states is a charge pumping method. The Chinese patent CN 101136347 discloses a measuring method for MOS transistor interface state. This measuring method comprises the following steps: step 1, obtaining a charge pumping current curve by the charge pumping measuring method, and obtaining another two charge pumping current curves by opening the drain terminal and the source terminal respectively; step 2, obtaining charge pumping currents at the source, drain, and channel by separating the identical and different portions of these three curves; step 3, obtaining the interface state densities at the source, drain, and channel from the charge pumping currents at the source, drain, and channel. However, as the critical dimension of the semiconductor device decreases continuously, the charge pumping method can not measure the charge pumping current accurately in the small device. This results from the small recombination current and the insufficient device accuracy. In addition, since current leakage is relatively large in a thin gate oxide, the influence of the gate oxide current leakage cannot be ignored in the measured bulk current, and this makes it difficult to measure accurately. Furthermore, as for the charge pumping method, the measured interface state density is an average value. In case of high-k dielectric material application, a large number of defects can be found not only in interface state, but also in the dielectric material, which significantly reduces the accuracy of the charge pumping method. Therefore, the conductance technique has attracted increasing attention in consideration of its accuracy.

The conductance technique is another method for measuring the interface state density. The basic principle is to measure the alternating current impedance Zm of a capacitor structure in the depletion region (the equivalent circuit is shown in FIG. 1a) with a measurement platform. FIG. 1b illustrates the equivalent circuit of the MOS capacitor in the depletion region, wherein Cox is the gate capacitance, and GT is the conductance corresponding to the path formed by electrons tunneling through the gate oxide, which generally can be ignored. GD is the capacitance of the depletion region, and Cit, Rit correspond to the impedance under a certain interface state density. FIG. 1c is a simplified circuit diagram of FIG. 1b, wherein Gp and Cp are equivalent impedance of the substrate. If GT is ignored, the equivalent circuit can be obtained as shown in FIG. 1d. There are two methods for characterizing interface state according to conductance spectra, i.e. a conductance-voltage technique and a conductance-frequency technique. The conductance-voltage technique is easy to operate and realize, but not accurate in theory. The conductance-frequency technique is accurate in theory. According to this theory, when the frequency of an alternating current signal coincides with the time constant of interface state at the Femi level, Gp/w has a maximum value.

In the conductance technique, the components connected in series of the structure to be measured may have a relatively large influence on the measurement results. Hence, in the method of converting the equivalent circuit as described above, the influence of such parasitic components can be modeled by incorporating certain parasitic elements in the circuit. Further, in the paper "A Methodology for Extraction of the Density of Interface States in the Presence of Frequency Dispersion via the Conductance Technique" on the IEEE transaction on electron devices by Sebastien et al. in 2010, it is proposed to modify the conductance technique, in which a fixed network of resistors and capacitors is used as an equivalent parasitic component for the structure to be measured. This method can effectively avoid the problem that the measured interface state density is an average interface state density in the conventional charge pumping method. In addition, in applications of high-k dielectric material, the interface state inside the high-k dielectric material can be measured. Therefore, this method is more accurate.

As mentioned above, during the actual measurement by the conductance technique, a series component such as a resistor in series with the device to be measured may have a remarkable influence on the measurement result. In the above mentioned paper, different models are used to eliminate these influences. As can be seen in the paper, the method is realized by incorporating an auxiliary device, and this auxiliary device is irrelevant with frequency.

SUMMARY OF THE INVENTION

Accordingly, at least one objective of the present invention is to provide series resistor model relevant with frequency. In particular, the present invention provides a method for measuring the interface state density by a conductance technique, which can optimize the parasitic component model during measurement, eliminate the interference of the parasitic component to the effective signal, and accurately simulate the actual situation during measurement.

To achieve these and other advantages and in accordance with the objective of the invention, as embodied and broadly described herein, the invention provides a method for measuring the interface state density, wherein, the method is applied by a conductance technique, which comprises the steps of:

biasing a MOS capacitor structure to be measured in an accumulation region, measuring the MOS capacitor structure under a fixed bias voltage and at predetermined scanning frequencies in the accumulation region by using a Gp-G model, and calculating the values of the series resistor in series with the MOS capacitor structure at the respective predetermined scanning frequencies to obtain a series resistor model; and obtaining an accurate model in an inversion region from the series resistor model varying with the predetermined scanning frequency obtained in the accumulation region; obtaining the measurement results of interface state according to the accurate model.

In one embodiment of the present invention, the Gp-G model is derived as a model equivalent with a measurement model, and in particular is a series connection of an accumulation capacitance Cox and a resistor Rs.

In one embodiment of the present invention, the measurement model is formed by connecting in parallel a measurement capacitor Cm and a measurement resistor Gm.

In one embodiment of the present invention, the value of the resistor Rs is obtained according to the measurement model and the equivalent Gp-G model, and the specific equation follows:

$$Z_m = \frac{1}{G_m + \frac{1}{-j\frac{1}{\varpi C_m}}} = R_s + \left(-j\frac{1}{\varpi C_{ox}}\right) = Z_{accumulation} \quad (1)$$

The equation for calculating resistor Rs is derived from equation (1):

$$R_s = \frac{G_m}{G_m^2 + \varpi^2 C_m^2} \quad (2)$$

wherein $Z_m$ is the impedance value of the measurement model, and $Z_{accumulation}$ is the impedance value of the Gp-G model.

In one embodiment of the present invention, the band of the predetermined scanning frequencies is identical with the band of the operating frequencies in the inversion region.

In one embodiment of the present invention, t the band of the predetermined scanning frequencies is in a range from 500 Hz to 1 MHz.

In one embodiment of the present invention, the accurate model in the inversion region is formed by connecting the parallel connection of the depletion capacitance Cc and the depletion resistor Gc in series with the resistor Rs.

In one embodiment of the present invention, the depletion capacitance Cc and the depletion resistor Gc are calculated according to the following equations respectively:

$$C_c = \frac{(G_m^2 + w^2 C_m^2)C_m}{a^2 + w^2 C_m^2}, \quad (3)$$

$$G_c = \frac{(G_m^2 + w^2 C_m^2)a}{a^2 + w^2 C_m^2} \quad (4)$$

wherein $a = G_m - (G_m^2 + w^2 C_m^2)R_s$.

Compared with the conventional technology, the present invention has the following beneficial effects.

1) By modeling the resistor in series with the device to be measured, the interference to the effective signal caused by the resistor during interface state measurement can be eliminated.

2) The series resistor model which varies with the predetermined scanning frequencies is obtained, making it possible to accurately simulate the actual situation during the measurement with the conductance technique.

3) The accuracy of interface state measurement is improved.

BRIEF DESCRIPTION OF THE DRAWINGS

The method for measuring the interface state density of the present invention will be elucidated by reference to the following embodiments and the accompanying drawings, in which:

FIG. 2c is a schematic diagram of the ideal model of the MOS capacitor structure to be measured in a depletion region in one embodiment of the present invention;

FIG. 2d is a schematic diagram of the actual model of the MOS capacitor structure to be measured is in a depletion region in one embodiment of the present invention;

FIG. 3 is a flowchart of the method for measuring the interface state density in one embodiment of the present invention.

DETAILED DESCRIPTION OF THE EMBODIMENTS

The method for measuring the interface state density of the present invention will be described in further details hereinafter with respect to the embodiments and the accompanying drawings.

Referring to FIG. 3, the method for measuring the interface state density by a conductance technique mainly comprises biasing a MOS capacitor structure to be measured in an accumulation region, measuring the MOS capacitor structure under a fixed bias voltage and at predetermined scanning frequencies in the accumulation region by using a Gp-G model, and calculating the values of the series resistor in series with the MOS capacitor structure at the respective predetermined scanning frequencies to obtain a series resistor model; obtaining an accurate model in an inversion region from the series resistor model varying with the predetermined scanning frequencies obtained in the accumulation region and obtaining the measurement results of interface state according to the accurate model. In the above process, the band of the predetermined frequencies is identical with the band of the operating frequencies in the inversion region, and the band of the predetermined frequencies is in a range from 500 Hz to 1 MHz.

Figure 1A:
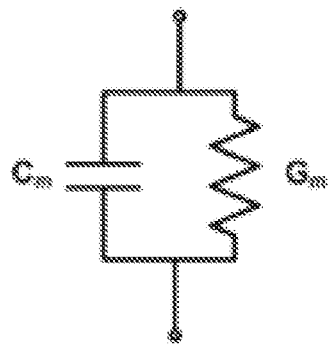
FIG. 1a, FIG. 1b, FIG. 1c, and FIG. 1d are conventional equivalent circuit diagrams for measuring interface state density by a conductance technique.
Figure 1B:
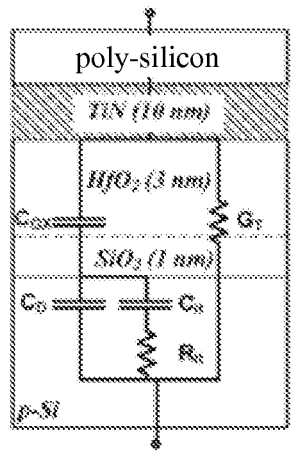
Figure 1C:
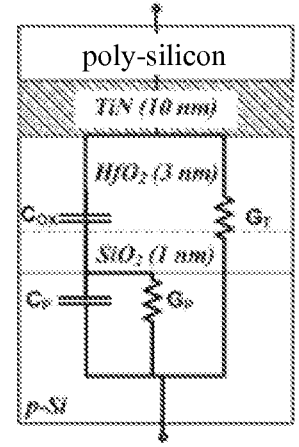
Figure 1D:
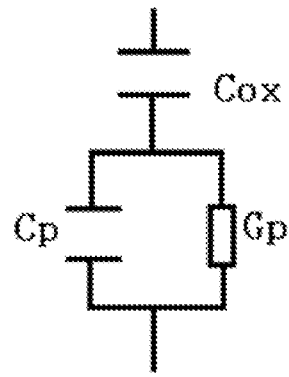
Figure 2A:
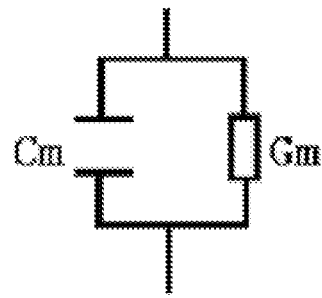
FIG. 2a is a schematic diagram of the measurement model in one embodiment of the present invention.
Figure 2B:
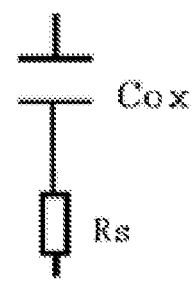
FIG. 2b is a schematic diagram of the Gp-G model of a MOS capacitor structure to be measured in an accumulation region in one embodiment of the present invention.

In particular, as shown in FIG. 2a and FIG. 2b, the measurement model is formed by connecting in parallel a measurement capacitor Cm and a measurement resistor Gm. Firstly, the MOS capacitor structure to be measured is biased in the accumulation region. In the conditions of the accumulation region, the Gp-G model is formed by connecting in series the accumulation capacitance Cox and the resistor Rs. The value of the resistor Rs can be obtained according to the measurement model and the equivalent Gp-G model, and the specific equation follows:

$$Z_m = \frac{1}{G_m + \frac{1}{-j\frac{1}{\varpi C_m}}} = R_s + \left(-j\frac{1}{\varpi C_{ox}}\right) = Z_{accumulation} \quad (1)$$

The equation for calculating resistor Rs can be derived from equation (1):

$$R_s = \frac{G_m}{G_m^2 + \varpi^2 C_m^2} \quad (2)$$

wherein $Z_m$ is the impedance value of the measurement model, and $Z_{accumulation}$ is the impedance value of the Gp-G model.

Now referring to FIG. 2c and FIG. 2d. The depletion region model is derived from the measurement model. Then, an accurate model in an inversion region is obtained, which is formed by connecting the parallel connection of the depletion capacitance Cc and the depletion resistor Gc in series with the resistor Rs. Herein, the depletion capacitance Cc and the depletion resistor Gc can be calculated according to the following equations respectively:

$$C_c = \frac{(G_m^2 + w^2 C_m^2)C_m}{a^2 + w^2 C_m^2}, \quad (3)$$

$$G_c = \frac{(G_m^2 + w^2 C_m^2)a}{a^2 + w^2 C_m^2} \quad (4)$$

wherein $a = G_m - (G_m^2 + w^2 C_m^2)R_s$.

From the value of the resistor Rs according to the above equation (2), the value of the depletion capacitance Cc and the value of the depletion resistor Gc can be calculated. Therefore, the value of the series resistor Rs is obtained in a condition that the MOS capacitor structure to be measured is in the accumulation region, and is a function of frequency. As compared with the conventional method using fixed series resistor Rs, this method of the present invention greatly improves the measurement accuracy.

In summary, according to the present invention, the method for measuring the interface state density models the series resistor in series with the device to be measured, and thus eliminates the interference to the effective signal caused by the series resistor during the measurement. Furthermore, the series resistor model which varies with the predetermined scanning frequency is obtained, making it possible to accurately simulate the actual situation during the measurement. The accuracy of measuring interfacial states with the conductance technique is improved.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method for measuring the interface condition density, wherein, the method is applied by a conductance technique, the method comprises the steps of:

biasing a MOS capacitor structure to be measured in an accumulation condition, measuring the MOS capacitor structure under a fixed bias voltage and at predetermined scanning frequencies in the accumulation condition by using a Gp-G model, wherein, the Gp-G model is formed by connecting in series an accumulation capacitance Cox and a resistor Rs and is equivalent with a measurement model; the measurement model is formed by connecting in parallel a measurement capacitor Cm and a measurement resistor Gm; and calculating the values of the series resistor Rs at respective predetermined scanning frequencies to obtain a series resistor model varying with the predetermined scanning frequencies; wherein, the value of the series resistor Rs is obtained according to the measurement model and the Gp-G model as follows:

$$Z_m = \frac{1}{G_m + \frac{1}{-j\frac{1}{\varpi C_m}}} = R_s + \left(-j\frac{1}{\varpi C_{ox}}\right) = Z_{accumulation} \quad (1)$$

$$R_s = \frac{G_m}{G_m^2 + \varpi^2 C_m^2} \quad (2)$$

wherein $Z_m$ is the impedance value of the measurement model, and $Z_{accumulation}$ is the impedance value of the Gp-G model;

obtaining an accurate model in an inversion condition from the series resistor model, wherein, the accurate model in the inversion condition is formed by connecting the parallel connection of the depletion capacitance Cc and the depletion resistor Gc in series with the series resistor Rs, wherein the depletion capacitance Cc and the depletion resistor Gc are calculated according to the following equations respectively:

$$C_c = \frac{(G_m^2 + w^2 C_m^2)C_m}{a^2 + w^2 C_m^2}, \quad (3)$$

$$G_c = \frac{(G_m^2 + w^2 C_m^2)a}{a^2 + w^2 C_m^2} \quad (4)$$

wherein $a = G_m - (G_m^2 + w^2 C_m^2)R_s$;

obtaining measurement results of interface condition according to the accurate model.

2. The method according to claim 1, wherein, the band of the predetermined scanning frequencies is identical with the band of the operating frequencies used in the inversion condition.

3. The method according to claim 2, wherein, the band of the predetermined scanning is in a range from 500 Hz to 1 MHz.

* * * * *